(12) United States Patent
Fan et al.

(10) Patent No.: US 10,305,501 B2
(45) Date of Patent: May 28, 2019

(54) METHOD FOR IMPROVING SPURIOUS FREE DYNAMIC RANGE (SFDR) AND SIGNAL-TO-NOISE-AND-DISTORTION RATIO (SNDR) OF CAPACITOR-RESISTOR COMBINED SUCCESSIVE APPROXIMATION REGISTER (SAR) ANALOG-TO-DIGITAL CONVERTER (ADC) BY CAPACITOR RE-CONFIGURATION

(71) Applicant: UNIVERSITY OF ELECTRONIC SCIENCE AND TECHNOLOGY OF CHINA, Chengdu (CN)

(72) Inventors: Hua Fan, Chengdu (CN); Hadi Heidari, Glasgow (GB); Franco Maloberti, Pavia (IT); Dagang Li, Chengdu (CN); Daqian Hu, Chengdu (CN); Yuanjun Cen, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 139 days.

(21) Appl. No.: 15/460,219

(22) Filed: Mar. 15, 2017

(65) Prior Publication Data
US 2018/0198457 A1 Jul. 12, 2018

(30) Foreign Application Priority Data
Jan. 9, 2017 (CN) .......................... 2017 1 0013589

(51) Int. Cl.
*H03M 1/00* (2006.01)
*H03M 1/10* (2006.01)
*H03M 1/38* (2006.01)

(52) U.S. Cl.
CPC ......... *H03M 1/004* (2013.01); *H03M 1/1009* (2013.01); *H03M 1/38* (2013.01)

(58) Field of Classification Search
CPC ....... H03M 1/004; H03M 1/1009; H03M 1/38
See application file for complete search history.

(56) References Cited

U.S. PATENT DOCUMENTS 6,798,370 B1 *  9/2004  Nagano ................. H03M 1/002
                                                            341/155
7,893,860 B2 *  2/2011  Cho ...................... H03M 1/069
                                                            341/155

(Continued)

*Primary Examiner* — Peter Dungba Vo
*Assistant Examiner* — Jeffrey T Carley
(74) *Attorney, Agent, or Firm* — Matthias Scholl P.C.; Matthias Scholl

(57) ABSTRACT

A method for improving a spurious free dynamic range and a signal-to-noise-and-distortion ratio of a capacitor-resistor combined successive approximation register analog-to-digital converter by capacitor re-configuration, the method including: 1) arranging 128 unit capacitors in a positive array and a negative array, respectively, dividing unit capacitors of symmetrical positions of the positive array and the negative array into groups to yield a total of 128 groups of capacitors; 2) acquiring 128 digital codes corresponding to 128 groups of capacitors; 3) sorting the 128 groups of capacitors from maximum to minimum according to the 128 digital codes obtained in 2), and recording the 128 groups of capacitors after sorting as $C_1$-$C_{128}$; and 4) selecting 64 groups of capacitors from $C_{33}$ to $C_{96}$, and reconfiguring the 64 groups of capacitors in capacitor arrays of the capacitor-resistor analog-to-digital converter.

1 Claim, 5 Drawing Sheets

(56) References Cited

U.S. PATENT DOCUMENTS

| | | | | |
|---|---|---|---|---|
| 8,760,331 | B2* | 6/2014 | Kaald | H03M 3/37 |
| | | | | 341/143 |
| 9,654,132 | B2* | 5/2017 | Venca | H03M 1/667 |
| 2006/0158365 | A1* | 7/2006 | Kernahan | H03M 1/38 |
| | | | | 341/155 |
| 2008/0117090 | A1* | 5/2008 | Barrenscheen | G06F 3/05 |
| | | | | 341/155 |
| 2008/0204299 | A1* | 8/2008 | Christ | H03M 1/367 |
| | | | | 341/158 |
| 2008/0297381 | A1* | 12/2008 | Kernahan | H03M 1/38 |
| | | | | 341/51 |
| 2010/0123611 | A1* | 5/2010 | Cho | H03M 1/069 |
| | | | | 341/156 |
| 2011/0291571 | A1* | 12/2011 | Fan | H05B 37/0227 |
| | | | | 315/152 |
| 2017/0201268 | A1* | 7/2017 | Sharma | H03M 1/1245 |

* cited by examiner

Conventional binary capacitive array

Unary capacitive array

METHOD FOR IMPROVING SPURIOUS FREE DYNAMIC RANGE (SFDR) AND SIGNAL-TO-NOISE-AND-DISTORTION RATIO (SNDR) OF CAPACITOR-RESISTOR COMBINED SUCCESSIVE APPROXIMATION REGISTER (SAR) ANALOG-TO-DIGITAL CONVERTER (ADC) BY CAPACITOR RE-CONFIGURATION

CROSS-REFERENCE TO RELATED APPLICATIONS

Pursuant to 35 U.S.C. § 119 and the Paris Convention Treaty, this application claims the benefit of Chinese Patent Application No. 201710013589.2 filed Jan. 9, 2017, the contents of which are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, MA 02142.

BACKGROUND OF THE INVENTION

Field of the Invention

The invention relates to a method for improving a spurious free dynamic range (SFDR) and a signal-to-noise-and-distortion ratio (SNDR) of a capacitor-resistor combined successive approximation register (SAR) analog-to-digital converter (ADC) by capacitor re-configuration.

Description of the Related Art

Conventional methods for capacitor mismatch calibration of an ADC generally suffer from complicate algorithms, large chip occupation area, and high power consumption. A capacitor-resistor combined architecture is known, as shown in FIG. 1. A typical 14-bit capacitor-resistor architecture SAR ADC includes a 6-bit main capacitive DAC and an 8-bit sub-resistive DAC, and the 6-bit main capacitive DAC includes 64 unit capacitors. Such capacitor-resistor combined architecture has excellent static linearity and no floating nodes. However, the calibration circuit is relatively complex, the operation of such ADC is sensitive to working environment, and the SFDR and SNDR leave much to be desired.

SUMMARY OF THE INVENTION

In view of the above-described problems, it is one objective of the invention to provide a method for improving a SFDR and a SNDR of a capacitor-resistor combined SAR analog-to-digital converter by capacitor re-configuration. By sorting, selecting, and re-configuring the capacitors, the calibration of the capacitor mismatch is realized. The method of the invention is adapted to improve the SFDR and SNDR of ADC simultaneously on the premise of ensuring the sampling rate. No complex least-mean-square (LMS) algorithm is needed and on-chip calibration is realized.

To achieve the above objective, in accordance with one embodiment of the invention, there is provided a method for improving a SFDR and a SNDR of a capacitor-resistor combined SAR analog-to-digital converter by capacitor re-configuration. The method comprises:

1) arranging 128 unit capacitors in a positive array and a negative array of a capacitor-resistor combined SAR analog-to-digital converter, respectively, dividing unit capacitors of symmetrical positions of the positive array and the negative array into groups to yield a total of 128 groups of capacitors;

2) connecting one capacitor of a first group in the positive array to positive reference voltage input (VREFP) and connecting the other capacitor of the first group in the negative array to negative reference voltage input (VREFN), while connecting capacitors of remaining groups in the positive array to VREFN and connecting capacitors of remaining groups in the negative array connect to VREFP, and allowing the analog-to-digital converter SAR to work at a 15-bit mode for conventional bit cycling to obtain a digital code corresponding to capacitors of the first group; and repeating the above process on capacitors of subsequent groups until 128 digital codes corresponding to 128 groups of capacitors is obtained;

3) sorting the 128 groups of capacitors from maximum to minimum according to the 128 digital codes obtained in 2), and recording the 128 groups of capacitors after sorting as $C_1$-$C_{128}$; and 4) selecting 64 groups of capacitors from $C_{33}$ to $C_{96}$, and reconfiguring the 64 groups of capacitors in capacitor arrays of the capacitor-resistor analog-to-digital converter according to an order as follows: $C_{33}$, $C_{96}$, $C_{35}$, $C_{94}$, $C_{37}$, $C_{92}$, $C_{39}$, $C_{90}$, $C_{41}$, $C_{88}$, $C_{43}$, $C_{86}$, $C_{45}$, $C_{84}$, $C_{47}$, $C_{82}$, $C_{49}$, $C_{80}$, $C_{51}$, $C_{78}$, $C_{53}$, $C_{76}$, $C_{55}$, $C_{74}$, $C_{57}$, $C_{72}$, $C_{59}$, $C_{70}$, $C_{61}$, $C_{68}$, $C_{63}$, $C_{66}$, $C_{65}$, $C_{64}$, $C_{67}$, $C_{62}$, $C_{69}$, $C_{60}$, $C_{71}$, $C_{58}$, $C_{73}$, $C_{56}$, $C_{75}$, $C_{54}$, $C_{77}$, $C_{52}$, $C_{79}$, $C_{50}$, $C_{81}$, $C_{48}$, $C_{83}$, $C_{46}$, $C_{85}$, $C_{44}$, $C_{87}$, $C_{42}$, $C_{89}$, $C_{40}$, $C_{91}$, $C_{38}$, $C_{93}$, $C_{36}$, $C_{95}$, and $C_{34}$.

Advantages of the method for improving the SFDR and the SNDR of the capacitor-resistor analog-to-digital converter by capacitor re-configuration according to embodiments of the invention are summarized as follows:

Capacitor mismatch calibration based on capacitor reconfiguring for SAR ADCs is applicable to any type of data converters. Capacitor reconfiguring only needs split the binary capacitive capacitors into unit capacitors, then adding more capacitors, measuring, sorting and reconfiguring all the unit capacitors to avoid the mismatch error accumulation in the middle point. Compared with the conventional complicated LMS algorithm calibration methods, the method of the invention does not sacrifice sampling rate, and is not sensitive to the environmental change, moreover, is much easier to realize on-chip calibration.

BRIEF DESCRIPTION OF THE DRAWINGS

The invention is described hereinbelow with reference to the accompanying drawings, in which.

DETAILED DESCRIPTION OF THE EMBODIMENTS

For further illustrating the invention, experiments detailing a method for improving a SI-DR and a SNDR of a capacitor-resistor combined SAR analog-to-digital converter by capacitor re-configuration are described below. It should be noted that the following examples are intended to describe and not to limit the invention.

Figure 2A:
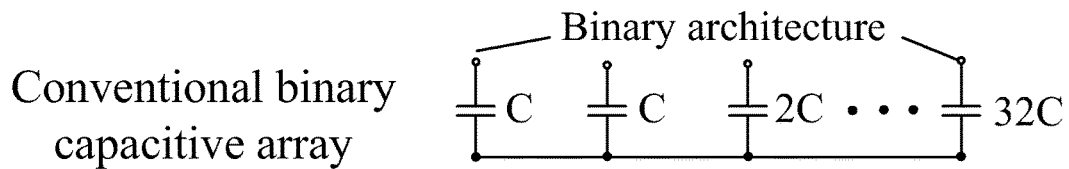
FIGS. 2A-2F illustrate a capacitor re-configuring method in accordance with one embodiment of the invention.

Capacitor re-configuring method is proposed to enhance the linearity of capacitor-resistor combined SAR ADC by splitting the conventional binary capacitors into unary capacitors and adding some extra unit capacitors. The more unit capacitors added, the better the performance related to SFDR and SNDR, but more power is consumed. Here, only 64 groups of unit capacitors are added for compromises. The details of capacitor-reconfiguring technique proposed are shown in FIG. 2A.

Figure 1:
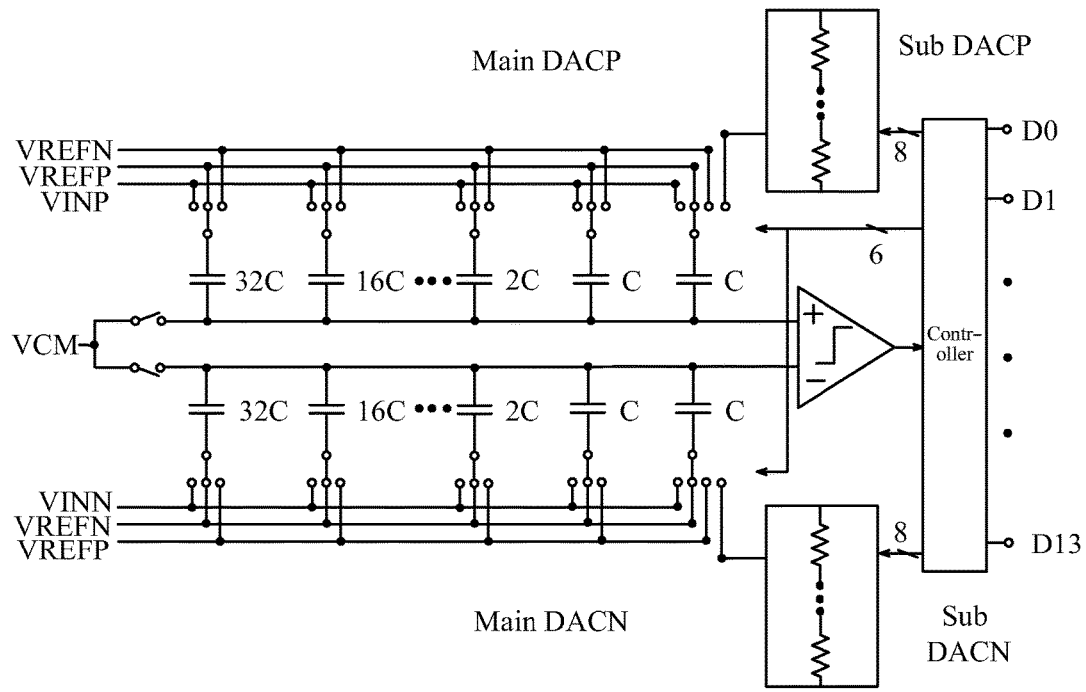
FIG. 1 is a circuit diagram of a conventional 14-bit capacitor-resistor architecture SAR ADC, in which, a 6-bit main capacitive DAC and an 8-bit sub-resistive DAC for a total of 14-bit conversion are configured, and the 6-bit main capacitive DAC comprises 64 unit capacitors.
Figure 2B:
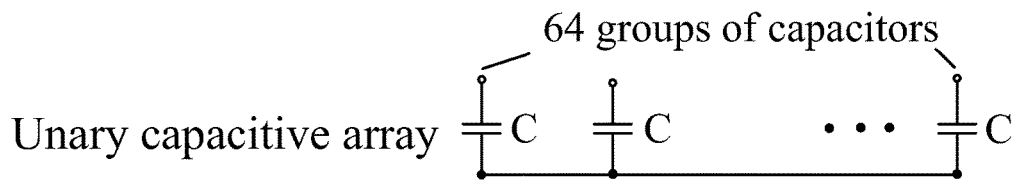
Figure 2C:
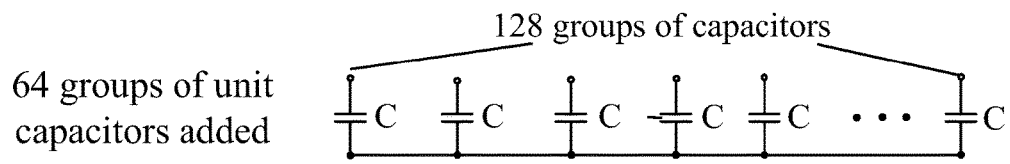
Figure 2D:
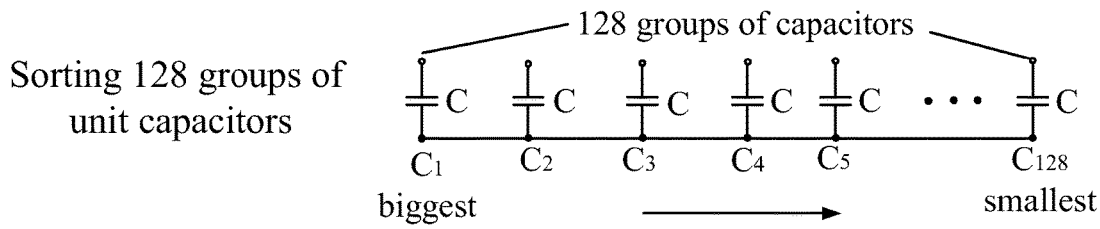
Figure 2E:
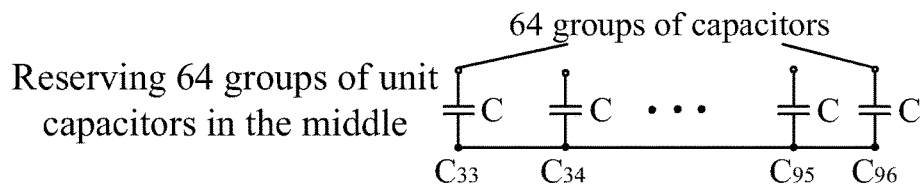
Figure 2F:
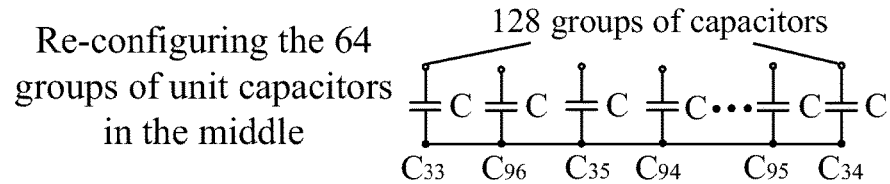
Figure 3:
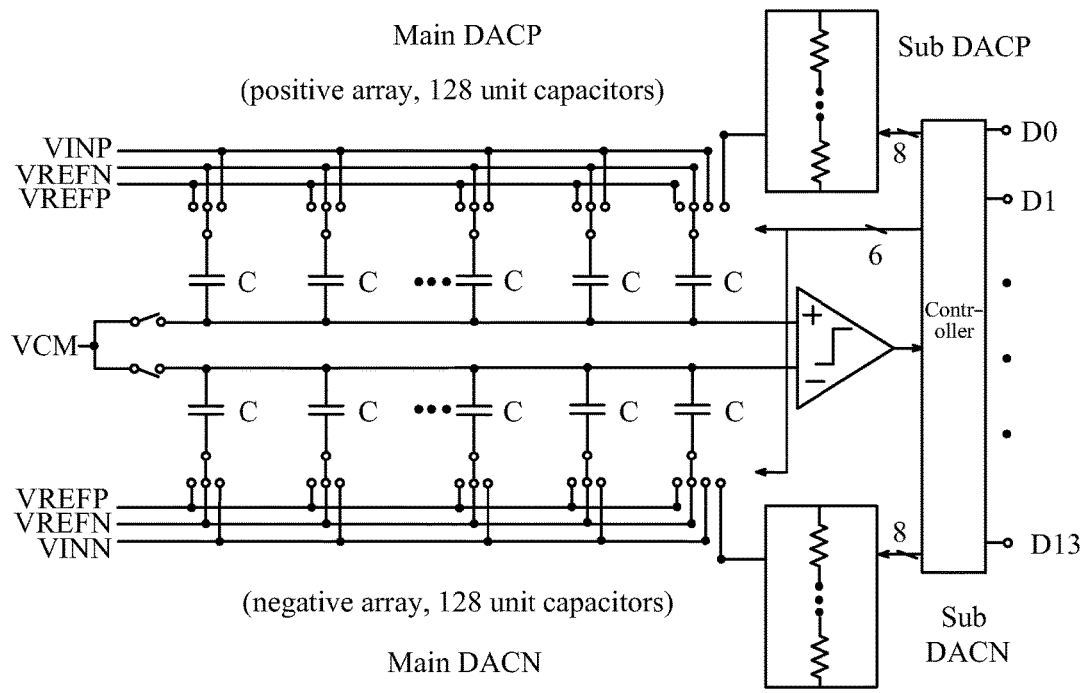
FIG. 3 is a circuit diagram of a 14-bit capacitor-resistor architecture SAR ADC in accordance with one embodiment of the invention.
Figure 4:
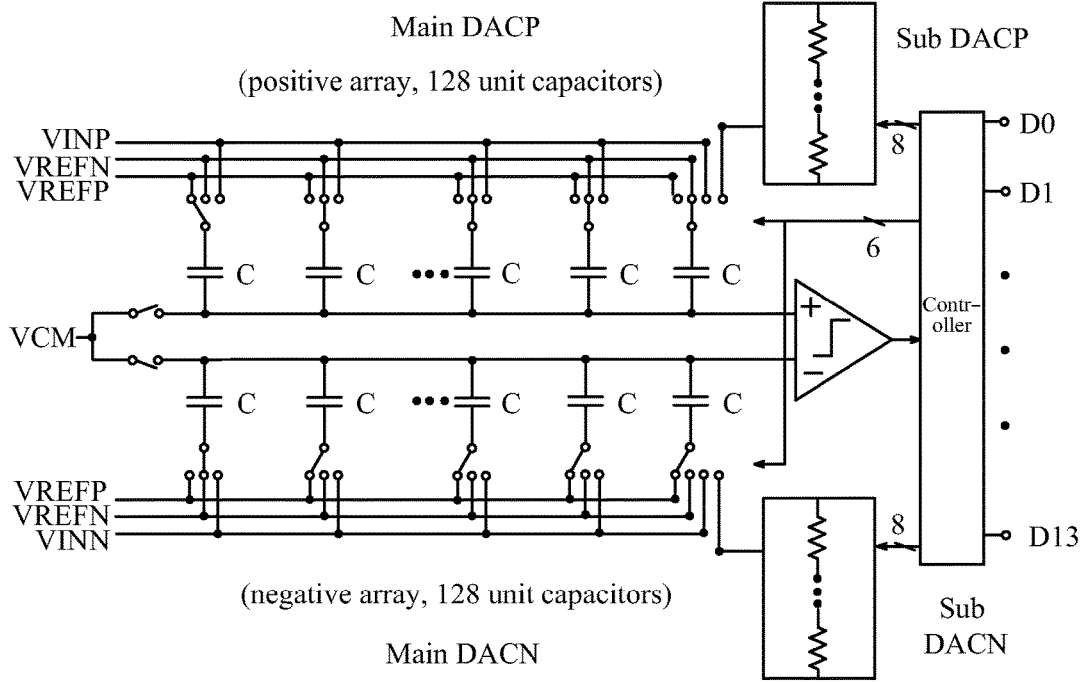
FIG. 4 is a circuit diagram adopted by a capacitor measurement method in accordance with one embodiment of the invention.

As well known, the conventional 6-bit binary capacitive DAC contains 64 unit capacitors in the positive array, and the negative capacitor array is symmetrical with the positive capacitor array, so only positive array is described here for simplicity. Unary architecture is applied to achieve optimum static linearity (FIG. 2B), also, it is convenient to implement the capacitor re-configuring scheme with unary capacitive architecture. At first, extra 64 unit capacitors are added, shown in FIG. 2C. Then, values of all the 128 capacitors are measured. Measurement of each capacitor is shown in FIG. 3, first, the first capacitor in the positive array is connected to positive reference voltage input (VREFP) while the remaining capacitors are kept to negative reference voltage input (VREFN), and the first capacitor in the negative array is connected to VREFN while the remaining capacitors are kept to VREFP, and a difference between top plates of positive and negative array corresponds to a proportion of the first capacitor. The conventional bit-cycling are proceeded, during the bit-cycling, the SAR ADC works at 15-bit mode to measure the value of the first capacitor, which means all the 128 capacitors work as a 7-bit capacitive main DAC prior to 8-bit resistor-string sub DAC, after measuring the first capacitor. The value of the second capacitor is measured with the same procedure, which repeats till values of all the 128 capacitors have been measured. After measuring the values of all 128 capacitors, the 128 capacitors are sorted from biggest to smallest, as shown in FIG. 2D), $C_1$ is the biggest and the $C_{128}$ is the smallest one. 32 capacitors in front and in the rear are respectively removed, and only the 64 capacitors in the middle (from $C_{33}$ to $C_{96}$ as shown in FIG. 2E) are reserved. $C_{33}$ to $C_{96}$ are used for the 6-bit capacitive DAC in FIG. 1, then the most important point is: the 64 capacitors (from C33 to C96) are re-ordered by "one head and one tail" with the capacitors of the odd-number position keep unchanged as follows: $C_{33}$, $C_{96}$, $C_{35}$, $C_{94}$, $C_{37}$, $C_{92}$, $C_{39}$, $C_{90}$, $C_{41}$, $C_{88}$, $C_{43}$, $C_{86}$, $C_{45}$, $C_{84}$, $C_{47}$, $C_{82}$, $C_{49}$, $C_{80}$, $C_{51}$, $C_{78}$, $C_{53}$, $C_{76}$, $C_{55}$, $C_{74}$, $C_{57}$, $C_{72}$, $C_{59}$, $C_{70}$, $C_{61}$, $C_{68}$, $C_{63}$, $C_{66}$, $C_{65}$, $C_{64}$, $C_{67}$, $C_{62}$, $C_{69}$, $C_{60}$, $C_{71}$, $C_{58}$, $C_{73}$, $C_{56}$, $C_{75}$, $C_{54}$, $C_{77}$, $C_{52}$, $C_{79}$, $C_{50}$, $C_{81}$, $C_{48}$, $C_{83}$, $C_{46}$, $C_{85}$, $C_{44}$, $C_{87}$, $C_{42}$, $C_{89}$, $C_{40}$, $C_{91}$, $C_{38}$, $C_{93}$, $C_{36}$, $C_{95}$, $C_{34}$, shown in FIG. 2F. Finally, the re-ordered 64 unit capacitors proceed with the normal binary search conversion.

Simulation Results:

To evaluate the improvement on the SFDR and SNDR of 14-bit capacitor-resistor combined ADC, the ADC is simulated in MATLAB instead of Cadence to avoid other circuit non-idealities, because the effectiveness of the calibration method is more concerned. In addition, MATLAB allows us to run extensive Monte Carlo simulations, which otherwise will be extremely time consuming to run in Cadence. In the simulation, only the capacitor mismatch is considered. The capacitor mismatch for every capacitor is randomly generated and the values of the unit capacitors are taken to be Gaussian random variables with standard deviations of 0.3%.

Figure 5:
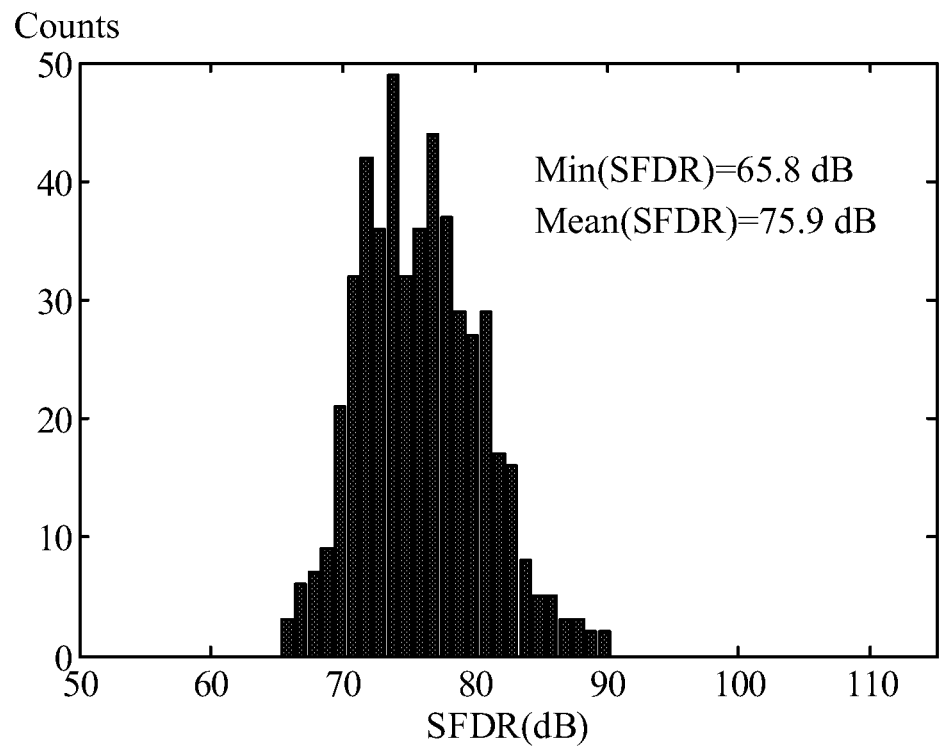
FIG. 5 is a chart of 500 Monte Carlo SI-DR simulation results for conventional 14-bit SAR ADC ($\sigma_u$=0.3%)
Figure 6:
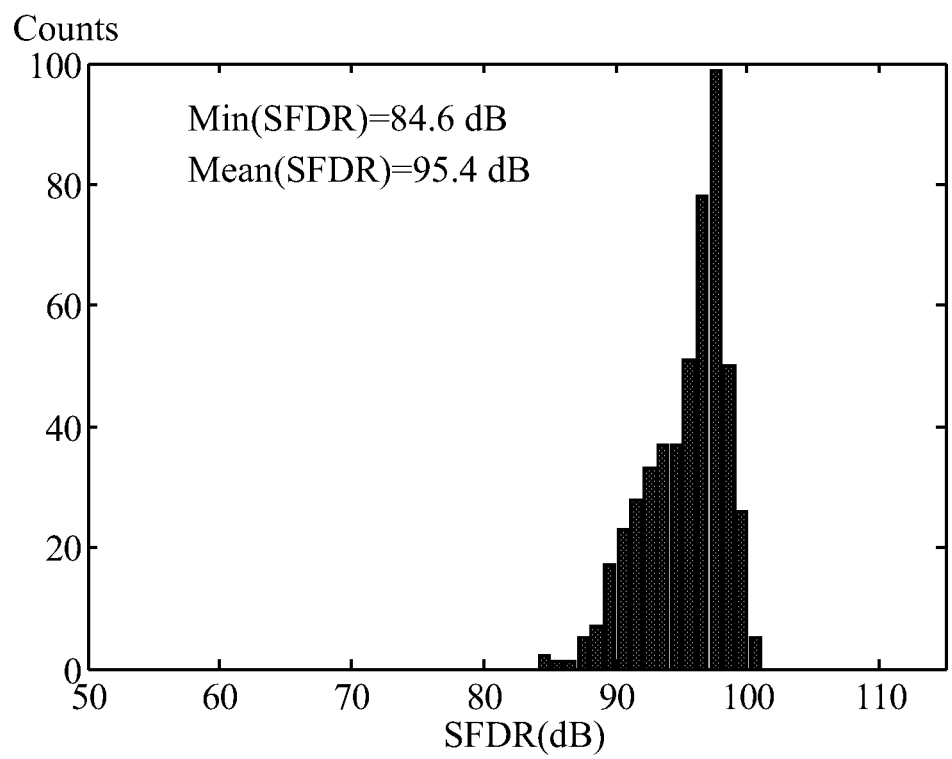
FIG. 6 is a chart of 500 Monte Carlo SFDR simulation results for 14-bit SAR ADC with capacitor re-configuring ($\sigma_u$=0.3%) in accordance with one embodiment of the invention.
Figure 7:
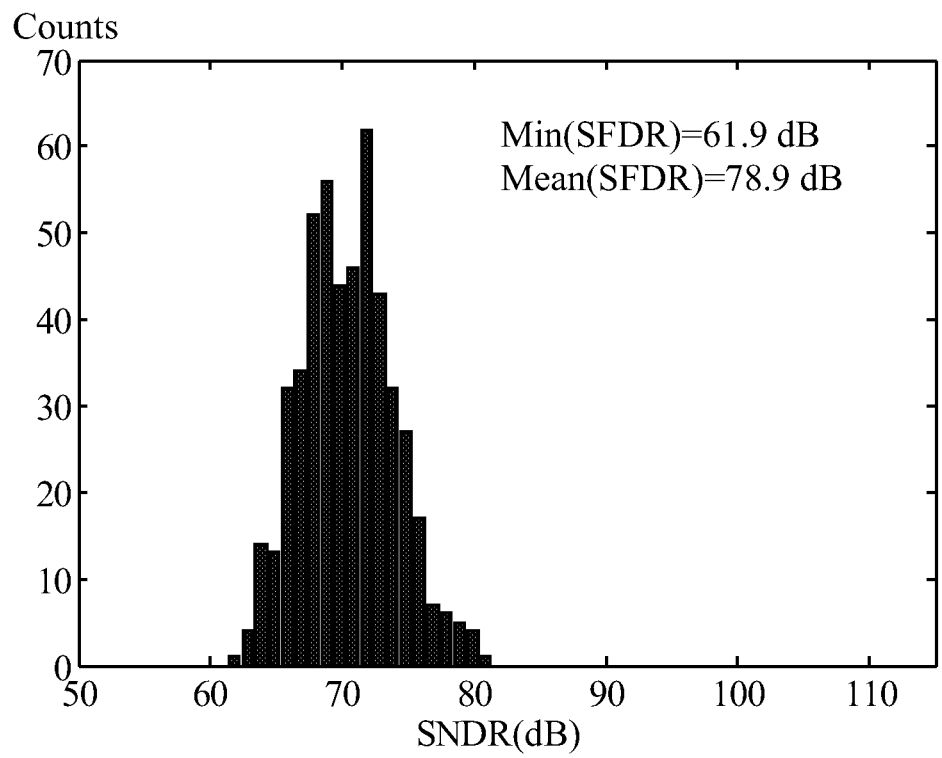
FIG. 7 is a chart of 500 Monte Carlo SNDR simulation results for conventional 14-bit SAR ADC ($\sigma_u$=0.3%)
Figure 8:
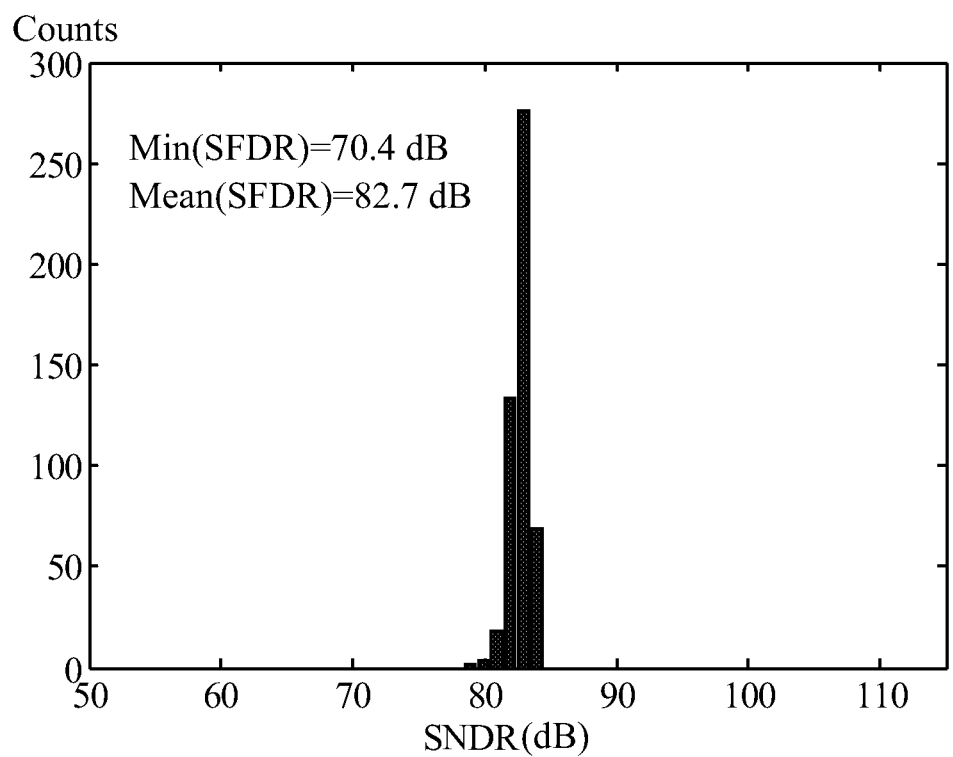
FIG. 8 is a chart of 500 Monte Carlo SNDR simulation results for 14-bit SAR ADC with capacitor re-configuring ($\sigma_u$=0.3%) in accordance with one embodiment of the invention.

FIG. 5 and FIG. 6 show 500 Monte Carlo SFDR simulation results for 14-bit SAR ADC with respectively conventional and capacitor re-configuring with $\sigma_u$=0.3%. In FIG. 5, without capacitor re-configuring technique, the worst-case and the averaged SFDR are 65.8 dB and 75.9 dB respectively with $\sigma_u$=0.3%. After using the capacitor re-configuring technique, as shown in FIG. 6, the averaged SFDR are improved from 75.9 dB to 95.4 dB. On the other hand, the improvement of SNDR is obvious by comparing FIG. 7 and FIG. 8, the averaged SNDR are improved from 70.4 dB to 82.7 dB Table 1 and Table 2 conclude 500 Monte Carlo SFDR and SNDR simulation results. In table 1, by using the capacitor re-configuring technique, the improvements of the averaged SFDR is 19.5 dB, also, 12.3 dB improvement of averaged SNDR is achieved in Table 2.

TABLE 1

Comparison of SFDR between conventional and proposed 14-bit ADC

|  | SFDR_min (dB) | SFDR_mean (dB) |
| --- | --- | --- |
| Conventional 14-bit SAR ADC | 65.8 | 75.9 |
| 14-bit SAR ADC with capacitor re-configuring | 84.6 | 95.4 |

TABLE 2

Comparison of SNDR between conventional and proposed 14-bit ADC

|  | SNDR_min (dB) | SNDR_mean (dB) |
| --- | --- | --- |
| Conventional 14-bit SAR ADC | 61.9 | 70.4 |
| 14-bit SAR ADC with capacitor re-configuring | 78.9 | 82.7 |

Capacitor re-configuring proposed in the invention is adaptable to any kind of capacitive SAR ADC. The Simulation results demonstrate excellent SFDR and SNDR improvements by using the capacitor re-configuring method of the invention.

Unless otherwise indicated, the numerical ranges involved in the invention include the end values. While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A method for improving a spurious free dynamic range and a signal-to-noise-and-distortion ratio of a capacitor-resistor combined successive approximation register analog-to-digital converter, the method comprising:

arranging 128 unit capacitors in each of a positive array and a negative array of a capacitor-resistor combined successive approximation register analog-to-digital converter, dividing unit capacitors of symmetrical positions of the positive array and the negative array into groups to yield a total of 128 groups of capacitors;

connecting one capacitor of a first group in the positive array to a positive reference voltage input (VREFP) and connecting the other capacitor of the first group in the negative array to a negative reference voltage input (VREFN), while connecting capacitors of remaining groups in the positive array to the VREFN and connecting capacitors of remaining groups in the negative array connect to the VREFP, and allowing the analog-to-digital converter successive approximation register to work at a 15-bit mode for conventional bit cycling to obtain a digital code corresponding to capacitors of the first group; and repeating the above process on capacitors of subsequent groups until 128 digital codes corresponding to the 128 groups of capacitors are obtained;

sorting the 128 groups of capacitors from maximum to minimum according to the 128 digital codes obtained, and recording the 128 groups of capacitors after sorting as $C_1$-$C_{128}$; and selecting 64 groups of capacitors from $C_{33}$ to $C_{96}$, and reconfiguring the 64 groups of capacitors in capacitor arrays of the capacitor-resistor analog-to-digital converter according to an order as follows: $C_{33}$, $C_{96}$, $C_{35}$, $C_{94}$, $C_{37}$, $C_{92}$, $C_{39}$, $C_{90}$, $C_{41}$, $C_{88}$, $C_{43}$, $C_{86}$, $C_{45}$, $C_{84}$, $C_{47}$, $C_{82}$, $C_{49}$, $C_{80}$, $C_{51}$, $C_{78}$, $C_{53}$, $C_{76}$, $C_{55}$, $C_{74}$, $C_{57}$, $C_{72}$, $C_{59}$, $C_{70}$, $C_{61}$, $C_{68}$, $C_{63}$, $C_{66}$, $C_{65}$, $C_{64}$, $C_{67}$, $C_{62}$, $C_{69}$, $C_{60}$, $C_{71}$, $C_{58}$, $C_{73}$, $C_{56}$, $C_{75}$, $C_{54}$, $C_{77}$, $C_{52}$, $C_{79}$, $C_{50}$, $C_{81}$, $C_{48}$, $C_{83}$, $C_{46}$, $C_{85}$, $C_{44}$, $C_{87}$, $C_{42}$, $C_{89}$, $C_{40}$, $C_{91}$, $C_{38}$, $C_{93}$, $C_{36}$, $C_{95}$, and $C_{34}$.

* * * * *